United States Patent [19]
Trager

[11] Patent Number: 5,835,390
[45] Date of Patent: *Nov. 10, 1998

[54] MERGED MULTI-STAGE COMB FILTER WITH REDUCED OPERATIONAL REQUIREMENTS

[75] Inventor: David S. Trager, Austin, Tex.

[73] Assignees: Asahi Kasei Microsystems Co., Ltd, Japan; Oasis Design, Inc.

[ * ] Notice: This patent issued on a continued prosecution application filed under 37 CFR 1.53(d), and is subject to the twenty year patent term provisions of 35 U.S.C. 154(a)(2).

[21] Appl. No.: 580,272

[22] Filed: Dec. 27, 1995

[51] Int. Cl.$^6$ ..................................................... G06F 17/10
[52] U.S. Cl. .................................................. 364/724.1
[58] Field of Search .......................................... 364/724.1

[56] References Cited

U.S. PATENT DOCUMENTS

| | | | |
|---|---|---|---|
| 4,851,841 | 7/1989 | Sooch | 341/143 |
| 4,920,544 | 4/1990 | Endo et al. | 375/26 |
| 4,999,798 | 3/1991 | McCaslin et al. | 364/724.1 |
| 5,043,933 | 8/1991 | Boutaud et al. | 364/724.1 |
| 5,061,928 | 10/1991 | Karema et al. | 341/143 |
| 5,079,734 | 1/1992 | Riley | 364/724.1 |
| 5,148,166 | 9/1992 | Ribner | 341/143 |
| 5,455,782 | 10/1995 | Young et al. | 364/724.1 |

OTHER PUBLICATIONS

Franca, et al., "Design of Analog—Digital VLSI Circuits for Telecommunications and Signal Processing", $2^{nd}$ Edition, Prentice Hall, pp. 251–289.

Hogenauer, "An Economical Class of Digital Filters for Decimation and Interpolation", *IEEE Trans. on Acoustics, Speech and Signal Processing*, vol. ASSP–29, No. 2 (Apr., 1981).

Chu, et al. "Multirate Filter Designs Using Comb Filters", *IEEE Trans. on Circuits and Systems*, vol. CAS–31, pp. 913–924 (Nov., 1984).

Moussavi, et al., "High–Order Single–Stage Single–Bit Oversampling A/D Converters Stabilized with Local Feedback Loops", *IEEE Trans. on Circuits and Systems*, vol. 41, No. 1, pp. 19–25 (Jan., 1994).

Crochiere, et al., "Interpolation and Decimation of Digital Signals—A Tutorial Review", *Proc. IEEE*, vol. 69, pp. 300–331 (Mar. 1981).

*Primary Examiner*—David H. Malzahn
*Attorney, Agent, or Firm*—Kevin L. Daffer; Conley, Rose & Tayon

[57] ABSTRACT

A digital filter is provided for achieving substantial attenuation of aliasing or imaging bands of a signal to be filtered. The digital filter employs a comb filter technique, wherein the comb filter can perform decimation or interpolation, depending upon its application. The comb filter is a multi-stage element, having more than one stage, and having an overall word length, $W_L$, optimally reduced. The total number of terms within the cumulative set of stages is also optimally reduced. The comb decimation or interpolation filter architecture is therefore of minimum size if employed in hardware, or utilizes minimal operations if employed in software. A filter element within the comb decimation or interpolation filter includes a z-transform $C_K(Z)$ term. The filter element can be reduced to a simple z-transform $1+z^{-1}$ term if the stage of interest includes a decimate-by-two or interpolate-by-two rate change switch.

6 Claims, 7 Drawing Sheets

MERGED MULTI-STAGE COMB FILTER WITH REDUCED OPERATIONAL REQUIREMENTS

BACKGROUND OF THE INVENTION

1. Field of the Invention

This invention relates to digital filters, and more particularly to a multi-rate digital filter implemented as a merged multi-stage comb filter. The merged multi-stage comb filter is designed having minimal terms and binary word length necessary to perform substantial attenuation of the alias or image frequency bands of an input signal.

2. Description of the Relevant Art

Multi-rate digital filters are generally well-known. For example, multi-rate digital filters are extensively used with oversampled analog-to-digital converters to remove quantization noise and reduce aliasing of spurious signals during sample rate reduction. Multi-rate digital filters may also be used with oversampled digital-to-analog converters to perform interpolation of the input signal. Multi-rate digital filters can therefore be used as anti-alias filters for sample rate reduction and as anti-imaging filters for sample rate multiplication.

Multi-rate filters employ not only a filtering component, but also a mechanism for changing the data transfer rate within the filter. The rate change mechanism is often referred to as a rate change switch employed either before or after the filtering component. The multi-rate filter, having both filter and a rate change mechanism, functions to (i) suppress or attenuate noise within the aliasing or imaging bands of a signal, and (ii) reduce (or increase) the data rate between the input and output terminals of the multi-rate unit. If the data rate is decreased, the filter is termed a "decimation" filter; if the data rate is increased, the filter is termed an "interpolation" filter.

The operation of a decimation filter consists of reducing the data rate, or sampling rate, of input signals from a high value $KF_s$ to a lower value $F_s$, where K is a data rate change factor of an amount greater than 1.0. Conversely, an interpolation filter increases the sampling rate of signals from a low value $F_s$ to a higher value $KF_s$. The magnitude of K therefore generally describes the decimation or interpolation factor. Decimation and interpolation filters employing finite impulse response (FIR) or infinite impulse response (IIR) techniques are more fully explained in reference to Franca, et al., *Design of Analog—Digital VLSI Circuits for Telecommunications and Signal Processing*, ($2^{nd}$ Ed., Prentice Hall), pp. 251–289 (herein incorporated by reference).

A disadvantage associated with conventional implementations of FIR and IIR filters, as opposed to comb filters, is that they require a coefficient multiplier at each of the plurality of taps associated with the FIR or IIR structure. Accordingly, each tap within the IIR or FIR structure requires a somewhat complex multiplier function, and each multiplier may have its own unique weighting factor. Achieving a distinct multiplier ratio for specific taps can require a fairly complex set of multiplier operations. It is therefore desirable that a less complex filtering technique be employed which, instead of using a multiplier operation, uses a simpler algorithm by which multiplication is performed with adders and delay elements only. The latter, less complex approach is typically used in comb decimation or interpolation filters. A description of conventional comb filters employing the simpler add and delay operations is provided in reference to Hogenauer, "An Economical Class of Digital Filters for Decimation and Interpolation", *IEEE Trans. on Acoustics, Speech and Signal Processing,* Vol. ASSP-29, No. 2, April, 1981 (herein incorporated by reference); and, Chu, et al., "Multirate Filter Designs Using Comb Filters", *IEEE Trans. on Circuits and Systems,* vol. CAS-31, pp. 913–924, November 1984 (herein incorporated by reference).

Comb filters can be generally constructed from basic building blocks called "terms". A term typically represents an operation embodied as a hardware element or a software instruction. A suitable operation provided in hardware involves one add and one delay element connected together in feedforward or feedback arrangement. If connected in feedforward with a negative add at the sum terminal, the term is said to represent a differentiator. If connected in feedback with a positive add at the sum terminal, the term represents an integrator. Integrators and differentiators are separated by downsampling or upsampling rate change switches for comb decimation and comb interpolation filters, respectively.

Figure 1:
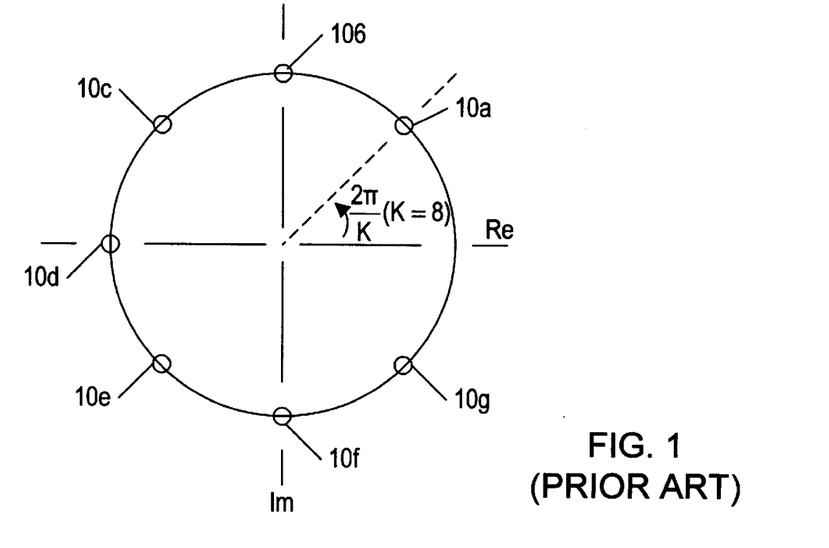
FIG. 1 illustrates zero points along a unit circle in the complex z-plane for a comb filter having a rate change factor K of 8.

Turning now to the drawings, FIG. 1 provides illustration of the zero points (roots) of the comb filter function plotted in the complex z-plane. FIG. 1 indicates several zero points, the first being point 10a, the second being 10b, etc. Typically, the length of the comb filter is set equal to the rate change factor K. If this is the case, each zero point lies in the center of each of the alias or image bands. In the example shown in FIG. 1, K equals 8, and there are seven (i.e., K-1) zero points about which the alias or image bands are formed. An order N, defined herein below, of the comb filter specifies the number of zeros at each zero point.

Figure 2:
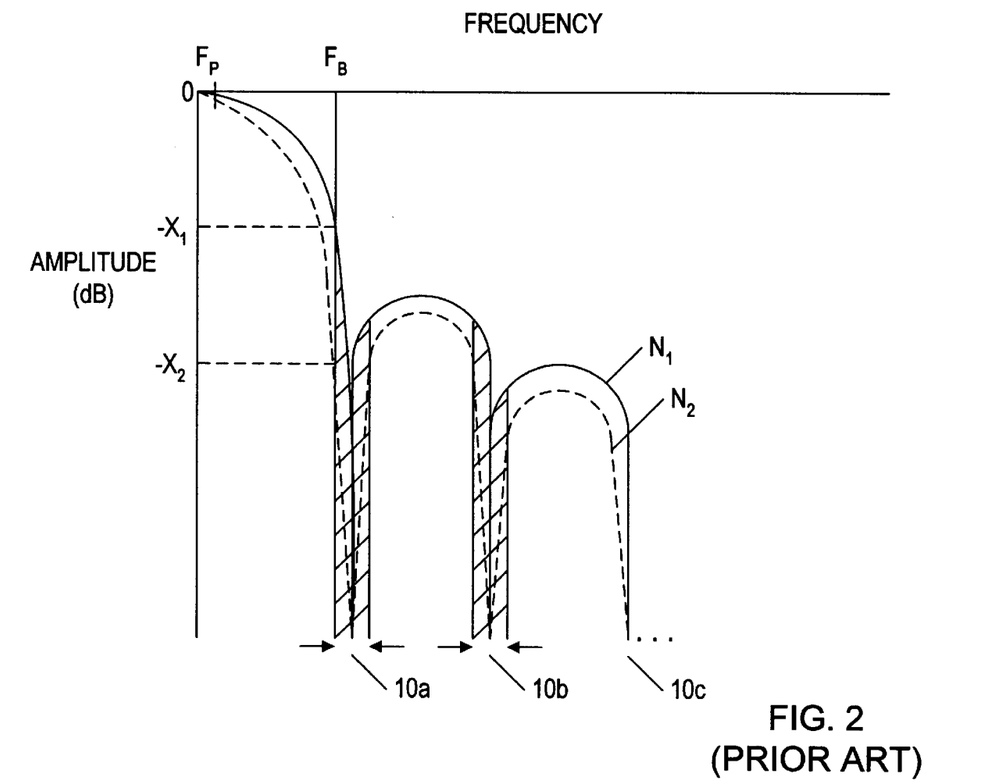
FIG. 2 illustrates a single stage comb filter amplitude frequency response for orders $N_1$ and $N_2$.

Referring now to FIG. 2, a portion of the frequency response of an exemplary comb filter is shown. Specifically, FIG. 2 illustrates the first three zero points 10a, 10b and 10c described in reference to FIG. 1. Zero points 10a–10c represent three of possibly K-1 zero points, where K is previously defined as the rate change factor. The passband is indicated as the frequency band extending from 0 to $F_p$, and the alias or image bands are indicated as the frequency bands of width $F_A$ centered at the zero points 10a–10c. Generally speaking, as the comb filter performs more of the total decimation or interpolation function, the relative width of the passband, $F_p$, will increase. As the passband increases, the aliasing or imaging bands, $F_A$, also increase in proportion to twice $F_p$.

Comb filters, in addition to their less complex nature, achieve superior rolloff characteristics. Higher frequencies naturally receive greater attenuation than lower frequencies. The rolloff benefits are particularly favorable when a comb filter is used as a low pass filter to remove oversampling quantizer noise. Since the lower frequency range is where the comb filter attenuation is lessened, if aliasing or imaging errors occur, they are most likely to occur at the lowest frequency edge, $F_B$, of the first (or lowest) aliasing or imaging band.

The primary function of a decimation or interpolation comb filter is to decrease or increase, respectively, the sampling rate and keep the passband aliasing or imaging error to within prescribed bounds. For example, if a design specification mandates a minimum stop band attenuation of $X_1$ dB for a given K rate change factor, then the comb filter will require $N_1$ orders to meet the design specification. However, as the minimum attenuation increases from attenuation level $X_1$ dB to level $X_2$ dB at point $F_B$, then the comb filter must employ additional orders, denoted in FIG. 2 as $N_2$. Accordingly, the minimum number of orders N is determined by many factors, several of which are the minimum attenuation specification for a given K factor and the total rate change factor of the system. If the number of orders N is not increased commensurate with a minimum attenuation increase, then the resulting comb structure cannot remove aliasing or imaging error according to specification.

It becomes apparent that, as attenuation requirements become more substantial, the comb filter structure must take on additional orders within its structure. As defined herein, an "order" refers to the amount of terms needed to employ the filter. An Nth order integrator separated by a rate change switch from an Nth order differentiator requires 2N terms—i.e., N terms for the integrator and N terms for the differentiator. A single Nth order integrator so separated from an Nth order differentiator is hereinafter referred to as a single stage comb filter. As will be discussed, a comb filter may be designed having more than one stage.

FIG. 2 illustrates the need for instilling additional orders to achieve stricter alias or image band attenuation. Additional orders, unfortunately, add to the overall complexity of the comb circuit design, both in hardware and software. Adding an additional order generally requires increasing the word length $W_L$ of bits forwarded to the first integrator (of a decimation filter) or output from the last integrator (of an interpolation filter), as well as increasing the number of terms by two.

Orders N are determined, inter alia, as a function of factor K as well as the minimum attenuation requirements. If quantity N is forced to increase to meet required attenuation or data rate change specification, so must the overall complexity of the comb filter. If comb filter complexity (i.e., term count and $W_L$) is allowed to unduly increase, the hardware representation may consume an unacceptably large amount of silicon area. If conceived in software, a complex comb filter may require an unacceptably large number of software instructions. It therefore becomes essential that a design methodology be employed which can minimize both the number of terms and $W_L$ needed in high order comb filters. The preferred design methodology may require several stages, while each stage must have minimal term count.

SUMMARY OF THE INVENTION

The problems outlined above are in large part solved by a multi-stage comb filter employing a new technique for reducing the overall complexity of the comb structure. Each stage of the comb filter includes a pair of filter elements optimized to consist of minimal term count. The comb filter can thereby be configured as a decimation filter or an interpolation filter, wherein at least the lower frequency stages of the decimation filter or the interpolation filter include filter elements which are implemented in a manner with minimal term count. According to one embodiment, comb filter orders for a stage are optimally implemented as either integrator and differentiator terms separated by a rate change switch, or directly as a comb filter operating at the higher sampling rate. Orders implemented as a comb filter operating at the higher sampling rate can be described by the following equation:

$$C_K(z) = \sum_{i=0}^{K-1} z^{-1} \qquad \text{(Eq. 1)}$$

where K is the rate change factor for the stage. Orders implemented as integrator and differentiator terms separated by a rate change switch have integrator terms cancelled with differentiator terms from the adjacent stage. As a result of the term cancellations, an optimized structure having minimal overall term count is obtained.

Broadly speaking, the present invention contemplates a multi-stage comb filter. The comb filter comprises numerous comb filter stages, one of which includes a first filter element connected by a rate change switch to a second filter element operable at a lower frequency than the first filter element. The multi-stage comb filter is optimized with minimal terms by instilling within the resulting first filter element a transfer function comprising a $C_K(Z)$ term. As denoted herein, a higher frequency filter element is an element having a z-transform function which operates at a data rate higher than the lower frequency filter element operating at a lower data rate. The lower and higher frequency filter elements are configured within a single stage of the multi-stage comb filter. The lower frequency filter element is therefore configured subsequent to a decimation data rate reduction switch, the other side of the switch being the higher frequency filter element. Conversely, the lower frequency element is an element configured immediately adjacent and preceding an interpolation data rate increasing switch, the other side of the switch being the higher frequency filter element.

According to one embodiment, the rate change switch produces samples of a signal forwarded through the first filter element at a rate less than the frequency of that signal. The samples are produced at, for example, one half the frequency of the signal.

According to another embodiment, the rate change switch produces samples of a signal forwarded through the first filter element at a rate greater than the frequency of that signal. The samples are produced, for example, at twice the frequency of the signal.

According to yet another embodiment, the $C_K(Z)$ term associated with the first filter element transfer function comprises an adder circuit and a delay circuit if implemented in hardware, or comprises an software-implemented operation performed by a CPU executing an instruction.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
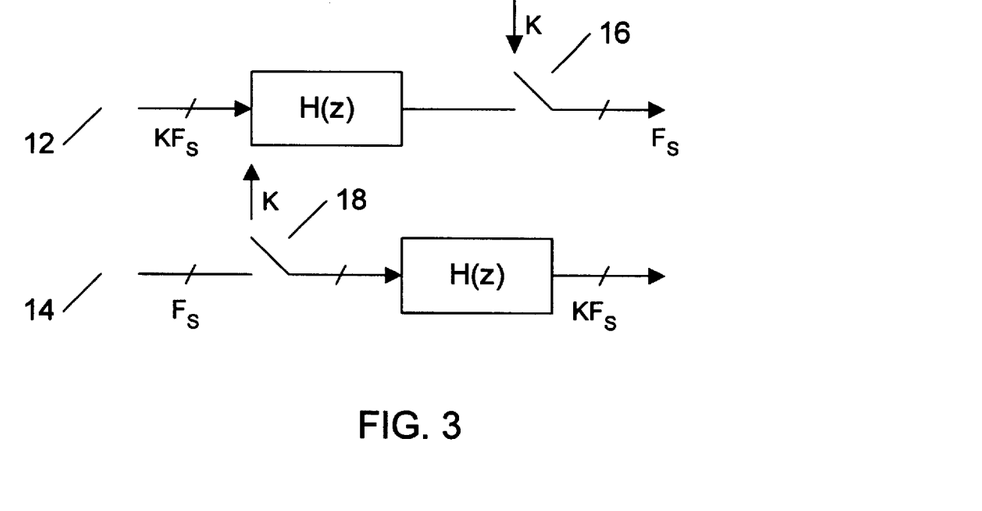
FIG. 3 is a symbolic representation of comb filter transfer functions H(z) preceding a decimation rate change switch and following an interpolation rate change switch.

Turning again to the drawings, FIG. 3 illustrates a comb filter transfer function H(z) embodied within a decimation comb filter 12 and an interpolation comb filter 14. Decimator 12 receives a data rate of $KF_s$ and thereafter produces a lower data rate $F_s$. Conversely, interpolator 14 receives a data rate $F_s$ and produces a higher data rate $KF_s$.

Change in data rate corresponds to factor K of rate change switches 16 and 18.

Transfer function H(z) within decimator 12 and interpolator 14 can be represented by the following equation:

$$H(z) = [C_K(z)]^N \quad \text{(Eq. 2)}$$

Where $C_K(Z)$, defined in equation 1 represents a running sum, sinc, or comb filter. It can be further expressed by the following equation:

$$C_K(z) = \sum_{i=0}^{K-1} z^{-1} = (1/1 - z^{-1})(1 - z^{-K}) \quad \text{(Eq. 3)}$$

$C_K(z)$ can therefore be described as:

$$C_K(z) = F(z) G(z^K) \quad \text{(Eq. 4)}$$

where F(z) is $1/(1-z^{-1})$, and $G(z^K)$ is $1-z^{-K}$.

Figure 4:
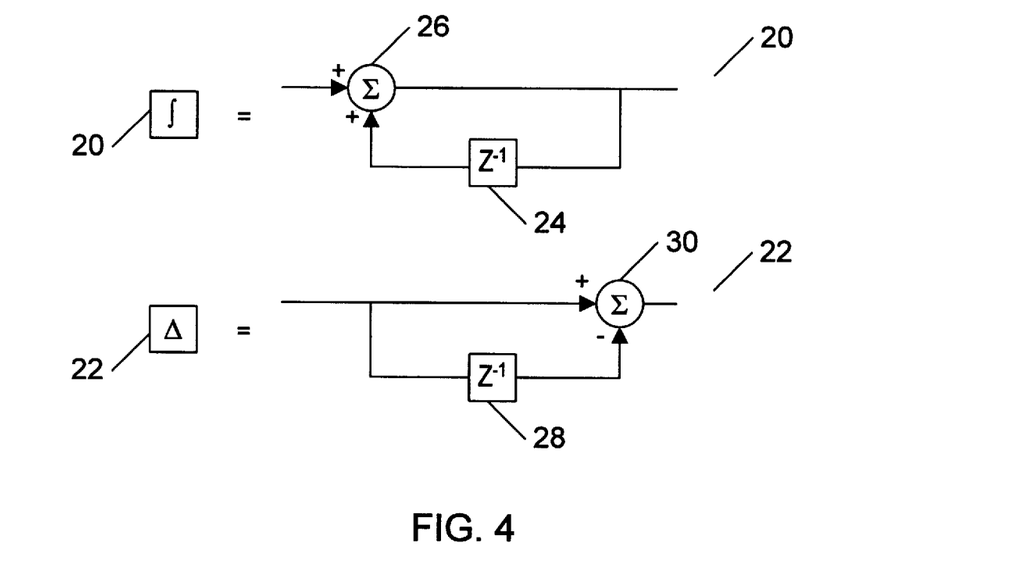
FIG. 4 are integrator and differentiator terms shown in equivalent symbolic and structural forms.

The z-transform function $1/1-z^{-1}$ component of $C_K(z)$ implements a discrete-time integrator, and is represented in FIG. 4 as reference numeral 20. The z-transform function $1-z^{-K}$ component of $C_K(z)$, when moved across the rate change switch becomes $1-z^{-1}$ and implements a discrete-time differentiator, and is shown in FIG. 4 as reference numeral 22. Integrator 20 is structurally equivalent to a feedback through a delay element 24 for additive summation with incoming data via adder 26. Differentiator 22 is structurally equivalent to a feedforward through delay element 28 for subtractive summation with incoming data via adder 30.

Figure 5:
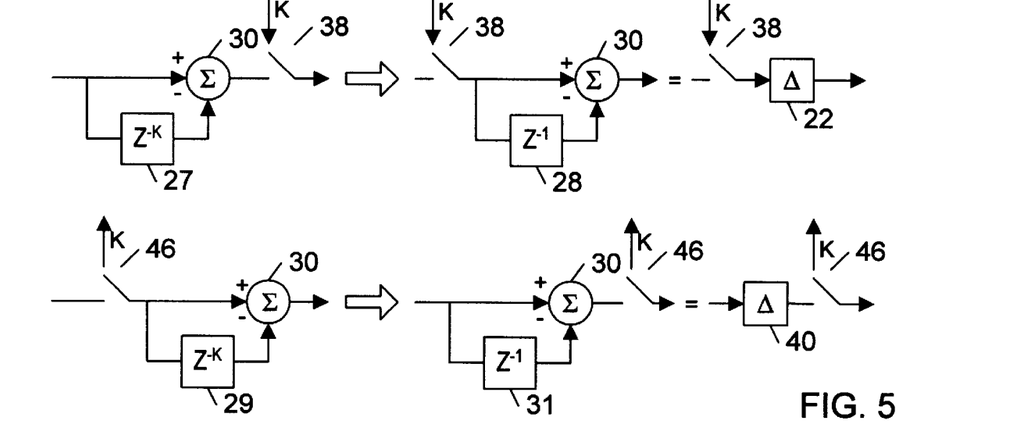
FIG. 5 illustrates an operation of moving a term across a rate change switch to derive a functionally equivalent and less complex structure.

FIG. 5 illustrates, for example, a $1-z^{-K}$ term moved across a rate change switch to obtain an equivalent, less complex structure. For example, the $z^{-K}$ delay element 27 is shown to change to $z^{-1}$ delay element 28 by moving it along with adder 30 across decimation switch 38. A multiple delay element 27 can thereby be transformed to a single delay element 28 and represented as a differentiator 22 following decimate switch 38. FIG. 5 also illustrates movement of the $z^{-K}$ delay element 29 and adder 30 across interpolation switch 46 to produce a single term differentiator having a single delay element 31. Moving components across decimation or interpolation switches is therefore useful in reducing design complexity. This principle is further described herein below.

Figure 6:
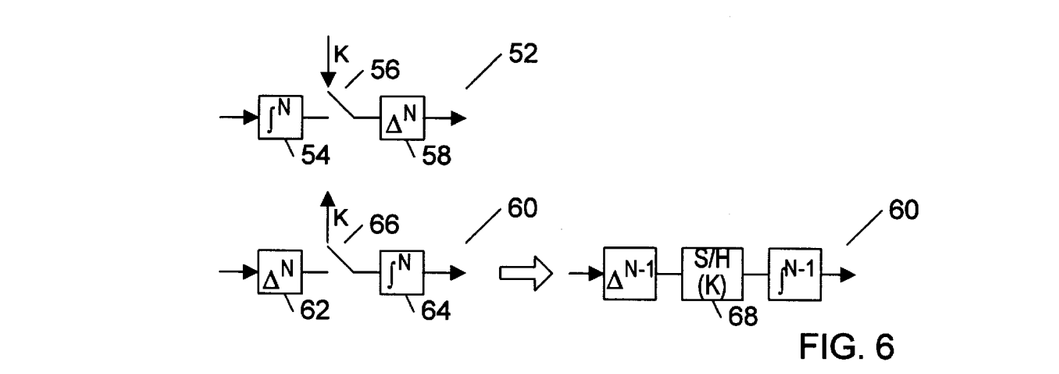
FIG. 6 is a symbolic representation of a single stage comb decimation filter having 2N terms and a comb interpolation filter having 2(N−1) terms.

Referring to FIG. 6, a single stage comb decimation filter 52 having 2N terms is shown in symbolic form. The single stage comb decimation filter includes a first filter element (i.e., integrator 54) and a second filter element (i.e., differentiator 58) arranged on opposing sides of decimate switch 56. Integrator 54 having n number of $1-z^{-K}$ terms would normally precede the decimation switch 56; however, through simplification shown in FIG. 5, the n number of terms $1-z^{-K}$ can be moved subsequent to decimation switch 56 and presented as differentiator 58. Differentiator 58 includes n number of terms, each of which have a single delay element. Thus, the comb decimator 52 can be reduced in complexity and implemented as shown. FIG. 6 further illustrates a single stage comb interpolation filter 60 having 2(N-1) differentiator and integrator terms. The single stage comb interpolation filter includes a first filter element (i.e., integrator 64) and a second filter element (i.e., differentiator 62) arranged on opposing sides of interpolation switch 66. Complexity of interpolator 60 has been reduced by moving the n number of $1-z^{-K}$ terms from the normal position subsequent to interpolator switch 66 to a position preceding switch 66, thus simplifying it to differentiator 62. Accordingly, like comb decimator 52, comb interpolator 60 is shown in its most efficient and least complex form. It is understood that one term of integrator 64 and differentiator 62 of comb interpolator 60 is symbolized as a sample and hold circuit 68 thereby reducing the term count of integrator 64 to N-1 and differentiator 62 to N-1.

Figure 7:
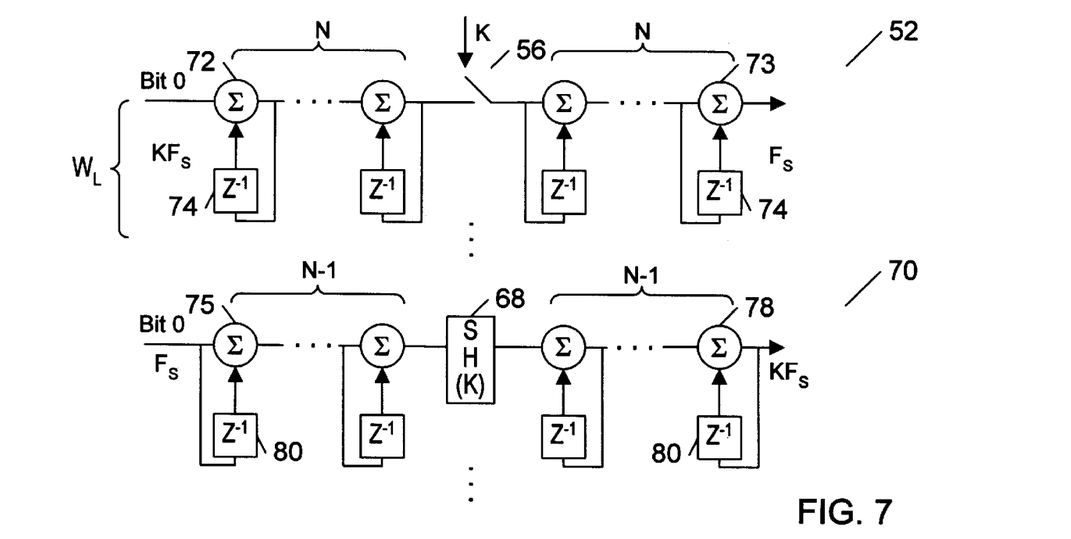
FIG. 7 illustrates structural components of the decimator and interpolator of FIG. 6.

FIG. 7 illustrates the structural components of comb decimator 52 and comb interpolator 70. Comb decimator 52 includes 2N quantity of adders 72 (and 73) and 2N quantity of single delay elements 74. The first N number of adders 72 and delay elements 74 represent a filter element (i.e., integrator 54), while the second N number of adders 734 and delay elements 74 represent another filter element (i.e., differentiator 58). Both elements are separated by decimation switch 56. Adders 72 and delay elements 74 are connected in series and shown as a single bit slice or a plurality of bit slices arranged in a parallel structure having a word length $W_L$. The bit slice shown in FIG. 7 is bit 0 of $W_L$. FIG. 7 further illustrates the structural components of comb interpolator 70. Interpolator 70 includes 2(N-1) adders 75 (and 78) and 2(N-1) single delay elements 80. Comb interpolator 70 includes N-1 differentiator terms in the first filter element and N-1 integrator terms in the second filter element.

Word length $W_L$ is dependent upon the quantity of terms N in each filter element as well as the decimation or interpolation rate change factor K. The number of bits within word length $W_L$ of comb decimation filter 52 is defined as follows:

$$W_L(\text{bits}) = N \times \log_2(K) + B_{IN} \quad \text{(Eq. 5)}$$

Figure 8:
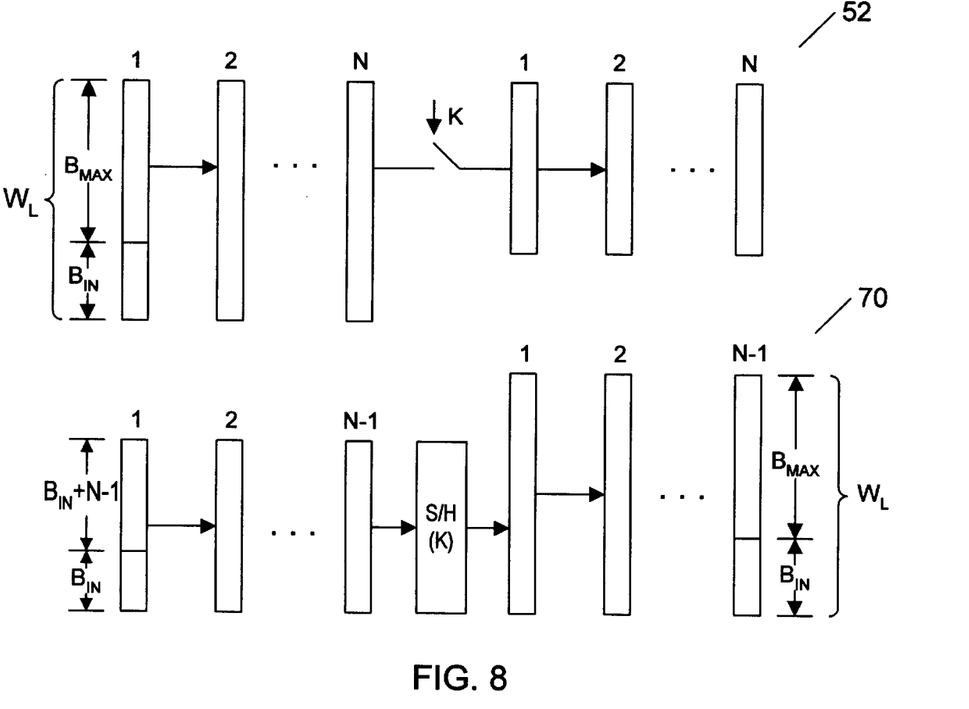
FIG. 8 illustrates word length requirements of the decimator and interpolator of FIG. 6.

As shown in FIG. 8, $B_{IN}$ represents the number of data bits input to the comb decimator 52. Comb decimator 52 depends on modulo arithmetic, and requires a wrap-around number system such as 2's complement to represent the data. The additional bits $B_{MAX}=W_L-B_{IN}$ are required to ensure correct operation of the comb decimation filter. It is possible to truncate the number of bits after each integrator and differentiator element to reduce the size of subsequent elements. Alternatively, truncation within a decimator can be performed only between the final integrator of the first element and the first differentiator of the second element. Regardless of truncation, however, maximum $W_L$ is dependent upon the number of bits calculated from equation 4. Therefore, it is crucial to reduce $W_L$ to reduce the implementation complexity.

Word length $W_L$ for the comb interpolator is defined as follows:

$$W_L = \log_2[(K)^{N-1}] + B_{IN} \qquad \text{(Eq. 6)}$$

Operation of comb interpolator 70 does not depend upon modulo arithmetic, and therefore, no overflow is permitted. Each register within comb interpolator 70 must have an upward length so that it will not overflow, with the final integrator having $B_{MAX}=W_L-B_{IN}$ additional bits. It is not possible to truncate within the comb interpolator, although preceding integrators and differentiators may have reduced upward length compared to subsequent elements. Alternatively, all differentiators may have a common length, and all integrators may have the maximal length as shown in FIG. 8. Again, regardless of length reduction, it is crucial to reduce $W_L$ to reduce the implementation complexity.

Figure 9:
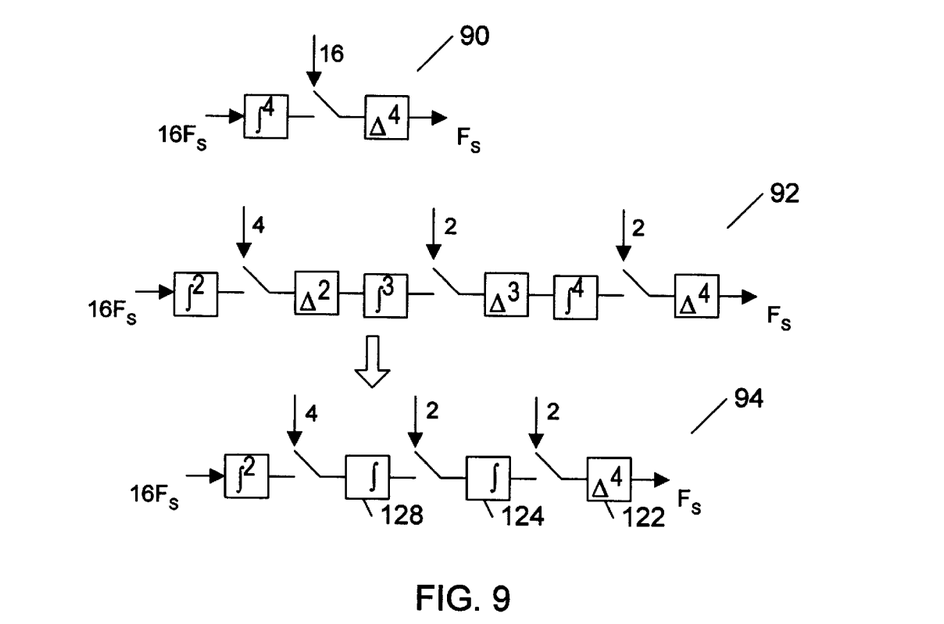
FIG. 9 is a symbolic representation of an exemplary single stage decimator and an exemplary multi-stage decimator having substantially similar performance characteristics.

FIG. 9 illustrates an exemplary eight term, single stage comb decimation filter 90. The exemplary comb filter 90 is used to illustrate a design implementation for reducing $W_L$, and the number of terms. For this example, the specification requires a decimation factor of 16, minimum stopband attenuation of 60 dB, and passband $F_p=0.11375 * F_s$ (the output sampling rate). Comb filter 90 is shown having an exemplary single decimation switch of factor K=16. Equation 5 indicates the number of bits within $W_L$ equals $4 \times \log_2(16) + B_{IN}$. Thus, the number of bits of $W_L$ for exemplary comb decimation filter 90 is $16+B_{IN}$. An effective way to reduce the number of bits within $W_L$, is to modify the single stage (single dual filter element) structure to a multi-stage (greater than one stage) structure denoted as reference numeral 92.

Exemplary multi-stage comb decimation filter 92 of FIG. 9 includes a three stage structure connected serially between an input data stream at $16F_s$ rate and an output data stream at $F_s$ rate. Structure 92 performs attenuation of signals within the aliasing bands to meet the required specification, but uses separate comb decimators to attenuate different alias bands. The lowest frequency band is attenuated by the final comb decimator, which therefore requires the highest order.

Structure 92 can be simplified by merging the three single stage comb filters into a single structure 94. hereafter termed a "merged multi-stage comb filter". FIG. 9 indicates integrator and differentiator filter elements arranged adjacent to each other (on the same side of the rate change switch). Thusly arranged filter elements can be combined with one another to yield a more simplified form, wherein differentiators are combined with and cancel integrators arranged on the same side of the switch as the differentiators. In the example shown, two or three term differentiators cancel respective two or three terms of three and four term integrators, respectively, resulting in a singular integrator term in both instances.

The merged multi-stage structure 94 performs filtering with fewer $W_L$ bits than the single stage structure 90. Using equation 5, $W_L$ bits of structure 94 equals $2 \times \log_2(4) + 3 \times \log_2(2) + 4 \times \log_2(2) + B_{IN}$. As such, structure 94 performs equivalent filtering with an $11+B_{IN}$ bit $W_L$ instead of a $16+B_{IN}$ bit $W_L$. Multi-bit structure 94 can therefore be configured in a smaller area upon a monolithic substrate then structure 90, with fewer hardware components. Further, structure 94 requires fewer software operations than structure 90.

Structure 94 still requires four integrator terms and four differentiator terms similar to structure 90. Thus, while $W_L$ is reduced by using a multi-stage configuration rather than a single stage configuration, the number of terms will generally remain the same or will slightly increase unless, as described below, further reduction and design enhancements are performed.

Figure 10:
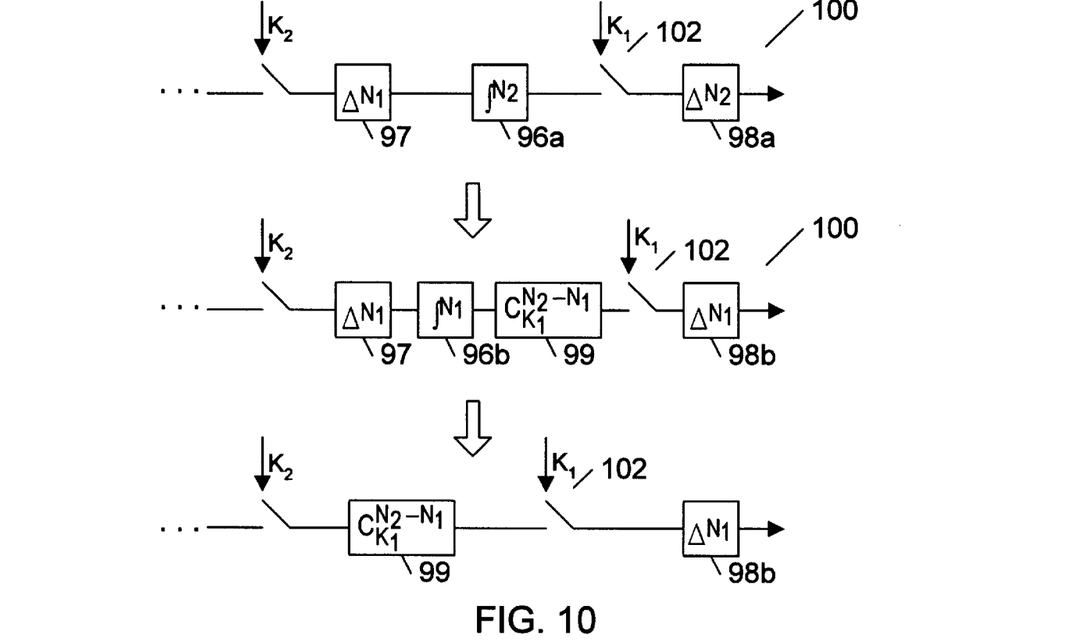
FIG. 10 represents a comb decimation filter having multi-stage filter elements, wherein one stage includes two filter elements and at least one term within the transfer function of the higher frequency filter element comprises a $C_K(Z)$ term.

Referring to FIG. 10, a single stage portion and part of another stage portion of a multi-stage comb decimation filter 100 is shown. The single stage portion includes a first filter element 96a and a second filter element 98a connected on opposites sides of a decimation rate change switch 102. Decimation rate change switch 102 ensures data rate transfer within filter element 96a is faster than data rate transfer within filter element 98a.

Alternatively, FIG. 10 further depicts an equivalent representation for the single stage portion and part of the other stage portion of a multi-stage comb decimation filter 100. In this representation, $N_1$ orders of the single stage portion are implemented as $N_1$ integrator terms 96b and $N_1$ differentiator terms 98b separated by a rate change switch 102. The remaining $N_2-N_1$ orders of the single stage portion are implemented as $C_{K1}(Z)$ terms 99. A reduction in the number of terms is obtained by merging the $N_1$ differentiators 97 and $N_1$ integrators 96b, leaving only $N_2-N_1$ $C_{K1}(Z)$ terms 99 and $N_1$ differentiator terms 98b. It should be noted that FIG. 10 illustrates one of possibly many methods which produce the same z-transform result within filter elements 99 and 98b. The implementation method shown in FIG. 10 can be applied to either a comb decimation filter or a comb interpolation filter, as will be discussed herein below.

Figure 11:
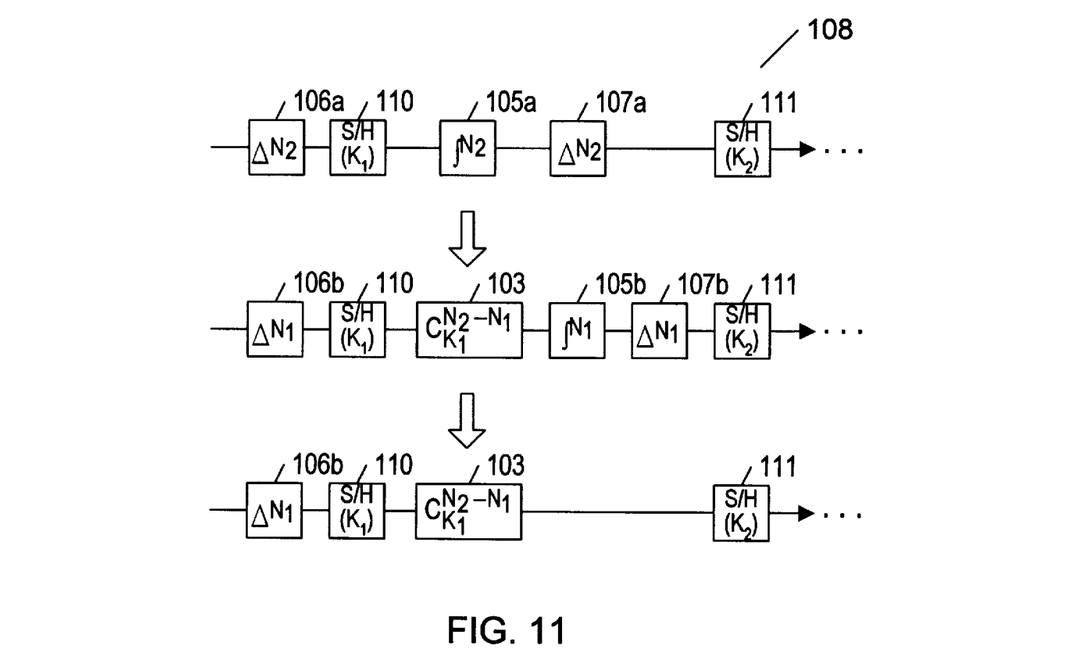
FIG. 11 is an comb interpolation filter having multistage filter elements, wherein one stage includes two filter elements and at least one term within the transfer function of the higher frequency filter element comprises a $C_K(Z)$ term.

Referring to FIG. 11, a single stage portion and part of another stage portion of a multi-stage comb interpolation filter 108 is shown. The single stage portion includes a first filter element 105a and a second filter element 106a connected on opposites sides of a sample-and-hold 110. Sample-and-hold 110 ensures data rate transfer within filter element 106a is slower than data rate transfer within filter element 105a. FIG. 11 also shows filter elements 107a connected on one side of sample and hold 111.

Alternatively, FIG. 11 further depicts an equivalent representation for the single stage portion and part of the other stage portion of a multi-stage comb interpolation filter 108. In this representation, $N_1$ orders of the single stage portion are implemented as $N_1$ integrator terms 105b and $N_1$ differentiator terms 106b separated by sample-and-hold 110. The remaining $N_2-N_1$ orders of the single stage portion are implemented as $C_{K1}(Z)$ terms 103. A reduction in the number of terms is obtained by merging the $N_1$ differentiators 107b and $N_1$ integrators 105b, leaving only $N_2-N_1$ $C_{K1}(Z)$ terms 103 and $N_1$ differentiator terms 106b. Again, it should be noted that FIG. 11 illustrates one of possibly many methods which produce the same z-transform result within filter elements 106b and 103.

Figure 12:
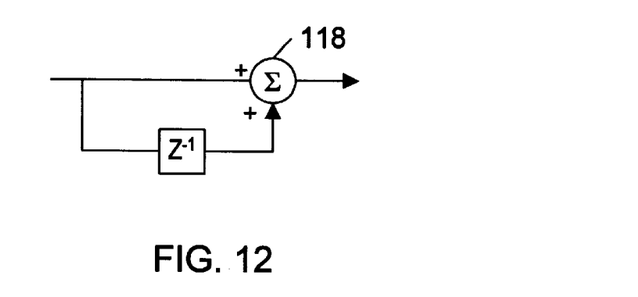
FIG. 12 illustrates structural add and delay components combined in a positive feedforward arrangement as found in the z-transform function of the higher frequency filter element or elements of FIGS. 10 and 11 when $K_1$ equals 2.

FIGS. 10 and 11 illustrate a term reduction in lower frequency, second filter element 98 and 106 from $N_2$ to $N_1$ (where $N_2$ is greater than $N_1$). The term count within first filter elements generally will either remain the same or, if an increase occurs, the increase is less than the decrease in the second filter element term count. Accordingly, the overall, net effect upon the term count is a reduction in the total number of terms within comb decimation or interpolation filters 100 and 108, respectively. In the case where $K_1$ in FIGS. 10 and 11 is equal to 2, a simple implementation for the $C_{K1}(Z)$ terms is obtained. In this case, $C_{K1}(z)$ simplifies to $1+z^{-1}$. FIG. 12 illustrates a structural representation of the $1+z^{-1}$ term. The $1+z^{-1}$ term is achieved by utilizing a feedforward configuration of delay component 116 with adder 118. Adder 118 provides positive summation of the feedforward delay signal with the incoming data stream. Thus, z-transform function $1+z^{-1}$ can be represented in feedforward differentiator form. Instead of the summation node performing negative summation as in a differentiator, $1+z^{-1}$ is performed with positive summation. The advantages of the new technique are further illustrated by way of an example.

Figure 13:
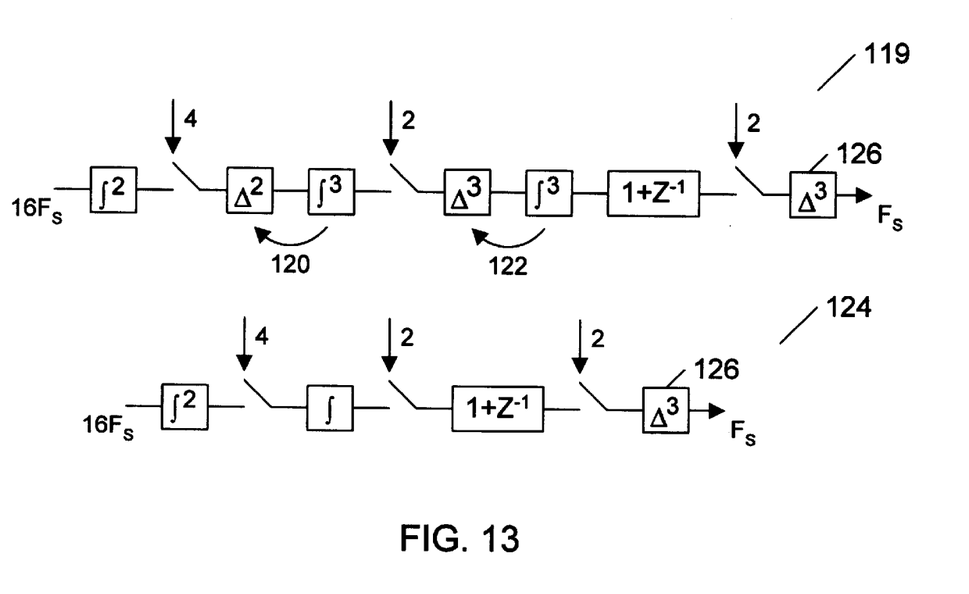
FIG. 13 is a symbolic representation of an exemplary multi-stage comb decimator of FIG. 9 shown as an equivalent representation with reduced term count.

Referring to FIG. 13, an exemplary eight term, multistage structure 119 is shown which is mathematically equivalent to structure 92 of FIG. 9, and hence performs the same decimation filtering function. Structure 119 is implemented using the new technique, where some orders of comb filter stages are optimally implemented as either integrator terms and differentiator terms separated by a decimation switch, or as comb filter elements optimized to $1+z^{-1}$ terms which operate at the higher sampling rate relative to differentiator terms 126. Adjacent integrator terms and differentiator terms are merged, as indicated by arrows 120 and 122 to yield the optimized form shown as reference numeral 124. Maximum word length $W_L$ is again 11+Bin bits, however, the overall, net change in term count is a reduction from eight terms to seven terms, in the exemplary embodiment of FIGS. 9 and 13. Thus a reduction in maximum $W_L$ and term count is achieved compared to the structure in FIG. 9.

For sake of brevity, other exemplary forms of a multistage comb decimator and interpolator need not be shown, as all would be included within the spirit and scope of the present invention. Further, other exemplary means of reducing the various multi-stage forms need not be shown since those forms and mechanisms are described with reference to the generic structures set forth in FIGS. 10 and 11. An explanation of all the various reduction techniques and structural representations thereof are known to a skilled artisan given the explanation set forth herein above.

Figure 14:
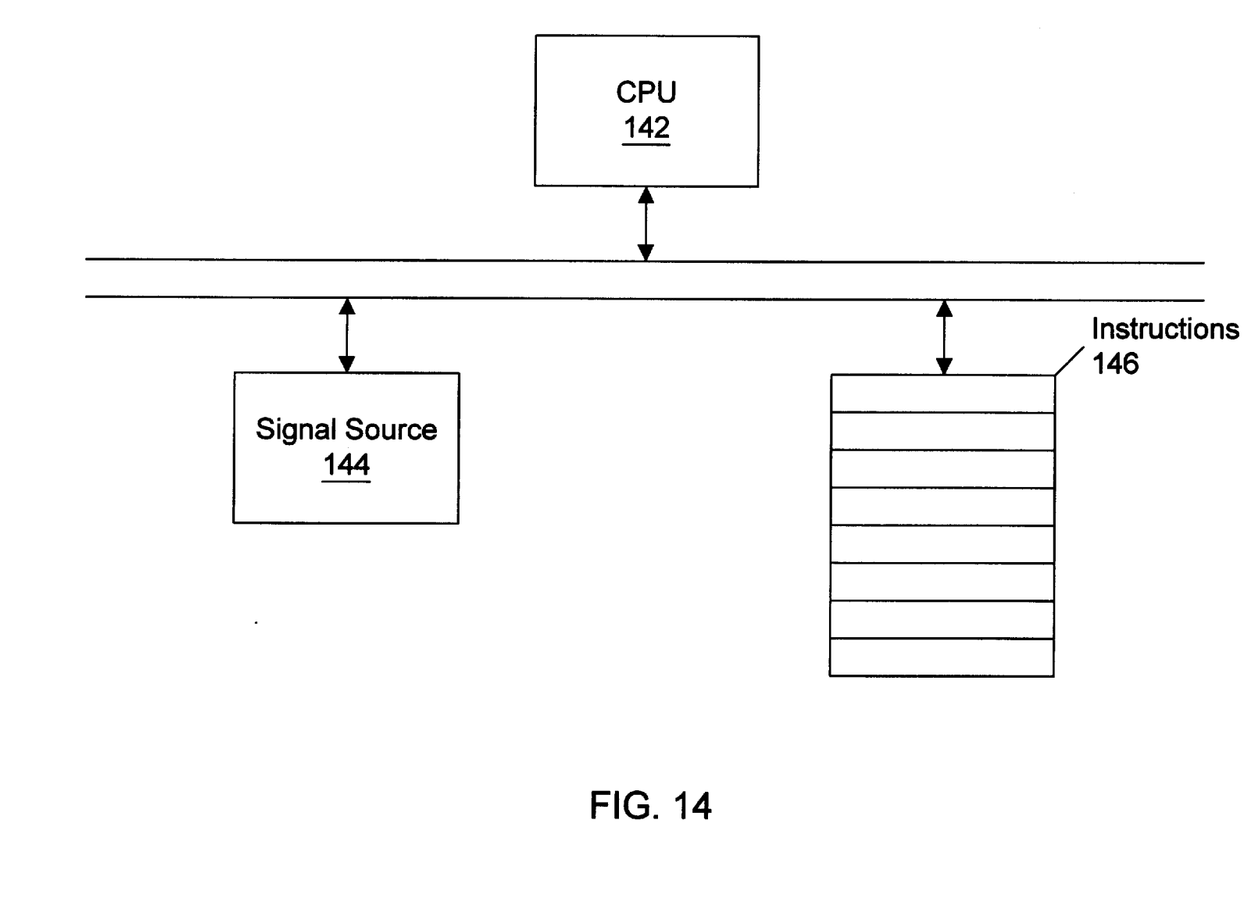
FIG. 14 illustrates implementing a filter term according to one embodiment of the present invention by executing instructions on a CPU.

FIG. 14 illustrates implementing a filter term according to one embodiment of the present invention by executing instructions 146 on a CPU 142 for filtering a signal from signal source 144.

It would be appreciated by those skilled in the art having the benefit of this disclosure that this invention is believed to be capable of applications with any type of digital comb filter. Furthermore, it is also to be understood that the invention shown and subscribed is to be taken as presently preferred embodiments. For example, the form of the invention shown is not to be limited to a specific number of stages, or a specific decimation or interpolation factor. The present comb filter need only employ more than two stages, having a unique transfer function of $C_K(Z)$ within at least one filter element, preferably the next to lowest frequency filter element within preferably the lowest frequency stage. Various modifications and changes may be made to the design structure to optimize the term count, as would be obvious to a person skilled in the art having the benefit of this disclosure. The specification and drawings are therefore to be regarded in an illustrative rather than in a restrictive sense.

What is claimed is:

1. A stage of a multi-stage comb filter, comprising:

a first filter element connected by a rate change switch to a second filter element operable at half the frequency of the first filter element;

said first filter element transfer function comprising a $1+z^{-1}$ term; and said second filter element comprising a differentiator.

2. The stage of a multi-stage comb filter as recited in claim 1, wherein said $1+z^{-1}$ term is implemented in circuitry that comprises an adder circuit and a delay circuit.

3. The stage of a multi-stage comb filter as recited in claim 1, wherein the rate change switch comprises a decimate-by-two rate change switch.

4. The stage of a multi-stage comb filter as recited in claim 1, wherein the rate change switch comprises an interpolate-by-two rate change switch.

5. The stage of a multi-stage comb filter as recited in claim 1, wherein said $1+z^{-1}$ term comprises an operation implemented by an instruction.

6. The stage of a multi-stage comb filter as recited in claim 1, wherein said first filter element transfer function is performed by a CPU executing an instruction.

* * * * *